(12) United States Patent
Shingu et al.

(10) Patent No.: US 7,821,059 B2
(45) Date of Patent: Oct. 26, 2010

(54) SEMICONDUCTOR DEVICE AND METHOD FOR MANUFACTURING A SEMICONDUCTOR DEVICE

(75) Inventors: Masao Shingu, Kawasaki (JP); Shoko Kikuchi, Kawasaki (JP); Akira Takashima, Fuchu (JP); Tsunehiro Ino, Fujisawa (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/234,197

(22) Filed: Sep. 19, 2008

(65) Prior Publication Data

US 2009/0242963 A1    Oct. 1, 2009

(30) Foreign Application Priority Data

Mar. 28, 2008  (JP) ............................ P2008-086770

(51) Int. Cl.
*H01L 21/8247*  (2006.01)
*H01L 29/788*  (2006.01)
*H01L 29/792*  (2006.01)
*H01L 29/78*  (2006.01)
*H01L 27/115*  (2006.01)

(52) U.S. Cl. ........................ 257/324; 257/314; 257/326; 257/411; 257/E29.309; 257/29.255; 257/E21.423; 257/E21.409; 438/287

(58) Field of Classification Search .................. 257/324, 257/411, E29.309, E21.423, E21.409, E29.255, 257/314; 438/287

See application file for complete search history.

(56) References Cited

U.S. PATENT DOCUMENTS 6,562,491 B1 *   5/2003   Jeon ............................ 428/697

(Continued)

FOREIGN PATENT DOCUMENTS

JP          2001-77111          3/2001

(Continued)

OTHER PUBLICATIONS

Mazza et al., Study On The Al2O3-SiO2-La2O3 Ternary System at 1300° C, Materials Research Bulletin, vol. 34, No. 9, 1999, pp. 1375-1382.*

(Continued)

*Primary Examiner*—Zandra Smith
*Assistant Examiner*—Jeremy J Joy
(74) *Attorney, Agent, or Firm*—Oblon, Spivak, McClelland, Maier & Neustadt, L.L.P.

(57) ABSTRACT

In a semiconductor device, the side walls are made of $SiO_2$, SiN or SiON, and the top insulating film or gate insulating film is made of an oxide including Al, Si, and metal element M so that the number ratio Si/M is set to no less than a number ratio Si/M at a solid solubility limit of $SiO_2$ composition in a composite oxide including metal element M and Al and set to no more than a number ratio Si/M at the condition that the dielectric constant is equal to the dielectric constant of $Al_2O_3$ and so that the number ratio Al/M is set to no less than a number ratio Al/M where the crystallization of an oxide of said metal element M is suppressed due to the Al element and set to no more than a number ratio Al/M where the crystallization of the $Al_2O_3$ is suppressed due to the metal element M.

4 Claims, 9 Drawing Sheets

U.S. PATENT DOCUMENTS

| | | | |
|---|---|---|---|
| 7,053,455 | B2 | 5/2006 | Koike et al. |
| 7,294,547 | B1* | 11/2007 | Orimoto et al. ............ 438/257 |
| 7,365,389 | B1* | 4/2008 | Jeon et al. .................. 257/325 |
| 2006/0157754 | A1* | 7/2006 | Jeon et al. .................. 257/288 |
| 2006/0289895 | A1* | 12/2006 | Kamata ...................... 257/192 |
| 2009/0057751 | A1* | 3/2009 | Ariyoshi et al. ............ 257/321 |
| 2009/0057753 | A1* | 3/2009 | Ino ............................. 257/324 |
| 2009/0206393 | A1* | 8/2009 | Ariyoshi et al. ............ 257/326 |
| 2009/0242958 | A1 | 10/2009 | Kikuchi et al. |
| 2009/0242963 | A1* | 10/2009 | Shingu et al. .............. 257/324 |

FOREIGN PATENT DOCUMENTS

| | | |
|---|---|---|
| JP | 2003-68897 | 3/2003 |
| JP | 2006-203200 | 8/2006 |

OTHER PUBLICATIONS

U.S. Appl. No. 12/506,588, filed Jul. 21, 2009, Takashima, et al.

U.S. Appl. No. 12/193,251, filed Aug. 18, 2008, Tsunehiro Ino.

U.S. Appl. No. 12/199,036, filed Aug. 27, 2008, Keiko Ariyoshi, et al.

U.S. Appl. No. 12/142,373, filed Jun. 19, 2008, Shoko Kikuchi, et al.

D. Mazza, et al., "Study on the $Al_2O_3$-$SiO_2$-$La_2O_3$ Ternary System At 1300° C", Materials Research Bulletin, vol. 34, No. 9, 1999, pp. 1375-1382.

Lin Li, et al., "Phase Diagram Prediction of the $Al_2O_3$-$SiO_2$-$La_2O_3$ System", J. Mater. Sci, Technol., vol. 15, No. 4, 1999, pp. 439-443.

V. Kahlenberg, et al., "$LaAlSiO_5$: a mixed anion rare earth alumosilicate", Institut für Mineralogie and Petrographie, Universität Innsbruck, Innrain 52, A-6020 Innsbruck, 1 page, 2003.

Daniel J. Lichtenwalner, et al., "Lanthanum silicate gate dielectric stacks with subnanometer equivalent oxide thickness utilizing an interfacial silica consumption reaction", Journal of Applied Physics, vol. 98, 2005, pp. 024314-1 to 024314-6.

D. H. Triyoso, et al., "Evaluation of lanthanum based gate dielectrics deposited by atomic layer deposition", J. Vac. Sci. Technol. B, vol. 23, No. 1, Jan./Feb. 2005, pp. 288-297.

J.-P. Maria, et al., "High temperature stability in lanthanum and zirconia-based gate dielectrics", Journal of Applied Physics, vol. 90, No. 7, Oct. 1, 2001, pp. 3476-3482.

M. Copel, et al., "Formation of a stratified lanthanum silicate dielectric by reaction with Si(001)", Applied Physics Letters, vol. 78, No. 11, Mar. 12, 2001, pp. 1607-1609.

J. S. Jur, et al., "High temperature stability of lanthanum silicate dielectric on Si (001)", Applied Physics Letters, vol. 90, 2007, pp. 102908-1 to 102908-3.

S. Stemmer, et al., "Structure and stability of $La_2O_3$/$SiO_2$ layers on Si(001)", Applied Physics Letters, vol. 79, No. 1, Jul. 2, 2001, pp. 102-104.

Ryota Fujitsuka, et al., "Thermal Stability and Electrical Properties of $(La_2O_3)_{1-x}(Al_2O_3)_x$ Composite Films", Japanese Journal of Applied Physics, vol. 44, No. 4B, 2005, pp. 2428-2432.

Ryota Fujitsuka, et al., "Thermal Stability and Electrical Properties of $(La_2O_3)_{1-x}(Al_2O_3)_x$ Composite Films", Extended Abstracts of the 2004 International Conference on Solid State Devices and Materials, P5-9, 2004, pp. 528-529.

Crystal Data Determinative Table Third Edition vol. II: Inorganic Compounds, 7 pages, 1972.

A. Besmehn, et al., "Surface characterisation and interface studies of high-k materials by XPS and TOF-SIMS", Applied Surface Science, vol. 252, 2005, pp. 172-176.

Phase Diagram for Ceramists (The American Ceramic Society), pp. 102, 107, 141, 104, 106, 101, and 165, 1995.

* cited by examiner

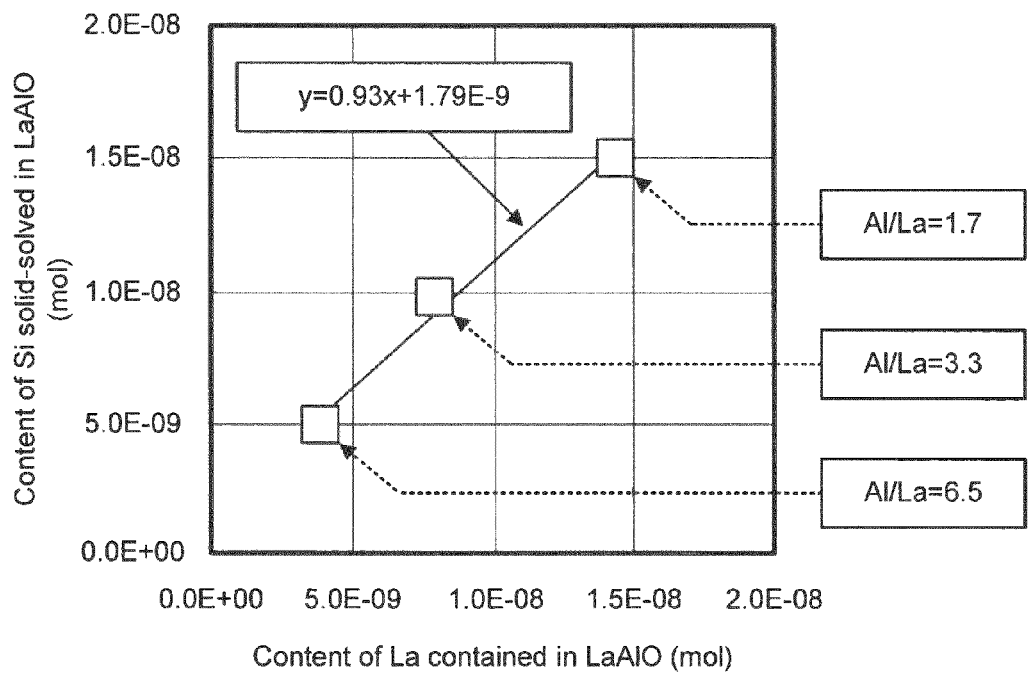

FIG. 6
(a) Before thermal treatment
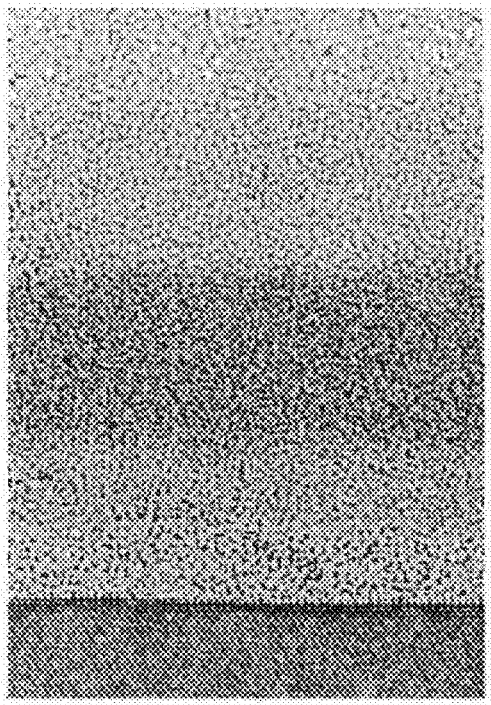
(b) After thermal treatment

SEMICONDUCTOR DEVICE AND METHOD FOR MANUFACTURING A SEMICONDUCTOR DEVICE

CROSS-REFERENCE TO RELATED APPLICATIONS

This application is based upon and claims the benefit of priority from the prior Japanese Patent Application No. 2008-086770, filed on Mar. 28, 2008; the entire contents of which are incorporated herein by reference.

BACKGROUND OF THE INVENTION

1. Field of the Invention

The present invention relates to a semiconductor device and a method for manufacturing a semiconductor device.

2. Description of the Related Art

A nonvolatile semiconductor memory device typified by an EEPROM is configured such that a tunnel insulating film, an electric charge storage layer, a top insulating film and a control gate electrode are stacked on a semiconductor substrate. Then, a high electric voltage is applied to the control gate electrode so as to infiltrate electrons into the electric charge storage layer from the semiconductor substrate through the tunnel insulating film to conduct writing operation. When the electric charge storage layer is made of a conductive material such as polycrystal silicon, the nonvolatile semiconductor memory device is called as a floating gate type semiconductor memory device. When the electric charge storage layer is made of an insulating material such as silicon nitride, the nonvolatile semiconductor memory device is called as a floating trap type semiconductor memory device.

In order to infiltrate an enough amount of electrons into the floating gate in the floating gate type semiconductor memory device, the capacitance ratio (coupling ratio) of the tunnel insulating film to the top insulating film is required to be set to an appropriate prescribed value. Conventionally, the capacitance ratio (coupling ratio) of the tunnel insulating film to the top insulating film is set to the prescribed value by enclosing the sides of the floating gate with the top insulating film.

With the development of the miniaturization of the semiconductor memory device, however, the height of the floating gate is required to be reduced. In order to realize the prescribed coupling ratio as desired while the height of the floating gate is reduced, the top insulating film is required to be thinned. However, the thinning of the top insulating film causes the increase of leak current from the floating gate and makes the storage of electric charge difficult. In this point of view, the top insulating film is made of a material with high dielectric constant so as to realize the desired coupling ratio while the thickness of the top insulating film is maintained.

Moreover, the floating trap type semiconductor memory device has the disadvantage of slow erasing operation. In order to realize fast erasing operation, it is required to discharge electrons from the electric charge storage layer into the semiconductor substrate under the condition that the infiltration of electrons from the control electrode into the electric charge storage layer is suppressed. In this point of view, the top insulating film of the semiconductor memory device is made of a material with high dielectric constant so as to realize the high insulation of the top insulating film.

In addition, in a semiconductor device such as a CMOS transistor, the gate insulating film is thinned as the semiconductor device is miniaturized, so that a large leak current via the thin gate insulating film becomes a main problem.

As the insulating film with high dielectric constant usable as the top insulating film of the semiconductor memory device and the like, the use of at least one selected from the group consisting of $HfO_2$, HfAlO, HfSiO, HfSiON, $ZrO_2$, ZrSiO, ZrSiON or a combination thereof is disclosed in Reference 1. Then, as the insulating material with high dielectric constant, an oxide containing La, Al and Si is disclosed in Reference 2.

[Reference 1] JP-A 2003-68897 (KOKAI)

[Reference 2] D. Mazza and S. Ronchetti, Mater Res Bull., vol. 34, No. 9, pp. 1375 to 1382, 1999

It is known that the above-described insulating film with high dielectric constant is reacted with $SiO_2$ through thermal treatment at a temperature more than a prescribed temperature to form silicate. In the semiconductor memory device, side walls made of $SiO_2$ are formed at both sides of the stacking structure of the tunnel insulating film, the electric charge storage layer, the top insulating film and the control gate electrode. Therefore, the top insulating film may react with the side walls through the thermal treatment for impurity activation to deteriorate the characteristics of the semiconductor memory device.

In the CMOS transistor, in contrast, since side walls made of SiN are formed at both side of the stacking structure of the gate insulating film and the gate electrode, the gate insulating film is unlikely to react with the side walls through thermal treatment even though the gate insulating film is made of the material with high dielectric constant, which is different from the semiconductor memory device. However, the gate insulating film may react with the side walls in dependence on the condition of the thermal treatment so as to deteriorate the characteristics of the CMOS transistor.

In addition, in the semiconductor device such as the CMOS transistor, if the gate insulating film is made of the insulating film with high dielectric constant, the gate insulating film may form a $SiO_2$ layer at the surface of the silicon substrate, so that a large amount of interface states are formed to deteriorate the characteristics of the transistor.

BRIEF SUMMARY OF THE INVENTION

An aspect of the present invention relates to a semiconductor device, including: a semiconductor substrate; a stacking structure including of a tunnel insulating film, an electric charge storage layer, a top insulating film and a control electrode which are subsequently formed on the semiconductor substrate; side walls formed so as to respectively cover sides of the stacking structure; and impurity doped layers formed at a surface of the semiconductor substrate on both sides of the tunnel insulating film, wherein the side walls are made of at least one selected from the group consisting of $SiO_2$, SiN and SiON, wherein the top insulating film is made of an oxide including Al, Si, and at least one metal element M selected from the group consisting of rare earth metal, Y, Zr and Hf so that a number ratio Si/M of Si element to the metal element M of the top insulating film is set to no less than a number ratio Si/M at a solid solubility limit of $SiO_2$ composition in a composite oxide including metal element M and Al and set to no more than a number ratio Si/M at the condition that a dielectric constant of the top insulating film is equal to a dielectric constant of $Al_2O_3$ and so that a number ratio Al/M of Al element to the metal element M of the top insulating film is set to no less than a number ratio Al/M where a crystallization of an oxide of the metal element M is suppressed due to the Al element and set to no more than a number ratio Al/M where a crystallization of the $Al_2O_3$ is suppressed due to the metal element M.

Another aspect of the present invention relates to a semiconductor device, including: a semiconductor substrate; a stacking structure including a gate insulating film and a gate electrode which are subsequently formed on the semiconductor substrate; side walls formed so as to respectively cover sides of the stacking structure; and impurity doped layers formed at a surface of the semiconductor substrate on both sides of the gate insulating film, wherein the side walls are made of at least one selected from the group consisting of $SiO_2$, SiN and SiON, wherein the gate insulating film is made of an oxide including Al, Si, and at least one metal element M selected from the group consisting of rare earth metal, Y, Zr and Hf, so that a number ratio Si/M of Si element to metal element M of the gate insulating film is set to no less than a number ratio Si/M at a solid solubility limit of $SiO_2$ composition in a composite oxide including metal element M and Al and set to no more than a number ratio Si/M at the condition that a dielectric constant of the gate insulating film is equal to a dielectric constant of $Al_2O_3$ and so that a number ratio Al/M of Al element to the metal element M of the gate insulating film is set to no less than a number ratio Al/M where a crystallization of an oxide of the metal element M is suppressed due to the Al element and set to no more than a number ratio Al/M where a crystallization of the $Al_2O_3$ is suppressed due to the metal element M.

Still another aspect of the present invention relates to a method for manufacturing a semiconductor device, including: forming, on a semiconductor substrate, a tunnel insulating film and an electric charge storage layer; forming, on the electric charge storage layer, at least two layers selected from an $SiO_2$ layer, an oxide of at least one metal element M selected from the group of rare earth metal, Y, Zr and Hf, an $Al_2O_3$ layer and a composite oxide layer including metal element M and Al; thermally treating, the at least two layers so as to be mixed with one another through thermal diffusion, thereby forming a top insulating film so that a number ratio Si/M of Si element to the metal element M of the top insulating film is set to no less than a number ratio Si/M at a solid solubility limit of $SiO_2$ composition in a composite oxide including metal element M and Al and set to no more than a number ratio Si/M at the condition that a dielectric constant of the top insulating film is equal to a dielectric constant of $Al_2O_3$ and so that a number ratio Al/M of Al element to the metal element M of the top insulating film is set to no less than a number ratio Al/M where a crystallization of an oxide of the metal element M is suppressed due to the Al element and set to no more than a number ratio Al/M where a crystallization of the $Al_2O_3$ is suppressed due to the metal element M; forming a control electrode on the top insulating film; etching the tunnel insulating film, the electric charge storage layer, the top insulating film and the control electrode in a stacking direction thereof, thereby forming a stacking structure including the tunnel insulating film, the electric charge storage layer, the top insulating film and the control electrode; forming side walls of at least one selected from the group consisting of $SiO_2$, SiN and SiON so as to cover sides of the stacking structure; and conducting ion implantation for the semiconductor substrate using the stacking structure and the side walls as a mask to form impurity doped layers at the surface of the semiconductor substrate on both sides of the tunnel insulating film.

A further aspect of the present invention relates to a method for manufacturing a semiconductor device, including: forming, on a semiconductor substrate, at least two layers selected from an $SiO_2$ layer, an oxide of at least one metal element M selected from the group of rare earth metal, Y, Zr and Hf, an $Al_2O_3$ layer and a composite oxide layer including metal element M and Al; thermally treating, the at least two layers so as to be mixed with one another through thermal diffusion, thereby forming a gate insulating film so that a number ratio Si/M of Si element to the metal element M of the gate insulating film is set to no less than a number ratio Si/M at a solid solubility limit of $SiO_2$ composition in a composite oxide including metal element M and Al and set to no more than a number ratio Si/M at the condition that a dielectric constant of the gate insulating film is equal to a dielectric constant of $Al_2O_3$ and so that a number ratio Al/M of Al element to the metal element M of the gate insulating film is set to no less than a number ratio Al/M where a crystallization of an oxide of the metal element M is suppressed due to the Al element and set to no more than a number ratio Al/M where a crystallization of the $Al_2O_3$ is suppressed due to the metal element M; forming a gate electrode on the gate insulating film; etching the gate insulating film and the gate electrode in a stacking direction thereof, thereby forming a stacking structure including the gate insulating film and the gate electrode; forming side walls of at least one selected from the group consisting of $SiO_2$, SiN and SiON so as to cover sides of the stacking structure; and conducting ion implantation for the semiconductor substrate using the stacking structure and the side walls as a mask to form impurity doped layers at the surface of the semiconductor substrate on both sides of the gate insulating film.

BRIEF DESCRIPTION OF THE SEVERAL VIEWS OF THE DRAWINGS

FIG. 1 is a graph showing the relation between the content of Si element solid-solved in a LaAlO composition and the content of La element in the LaAlO composition.

FIG. 2 is a view showing the number of M element in a unit cell of an oxide MO (M=Y, Pr, Zr, Nd, Sm, Gd, Hf), and the lower limited value and the upper limited value of the Al/M number ratio.

FIG. 6 is a cross sectional TEM image of a stacking structure made of a $SiO_2$ layer, a SiON layer, a LaAlSiO layer, a $SiO_2$ layer which are subsequently formed on a Si substrate before and after thermal treatment.

DETAILED DESCRIPTION OF THE INVENTION

Figure 3:
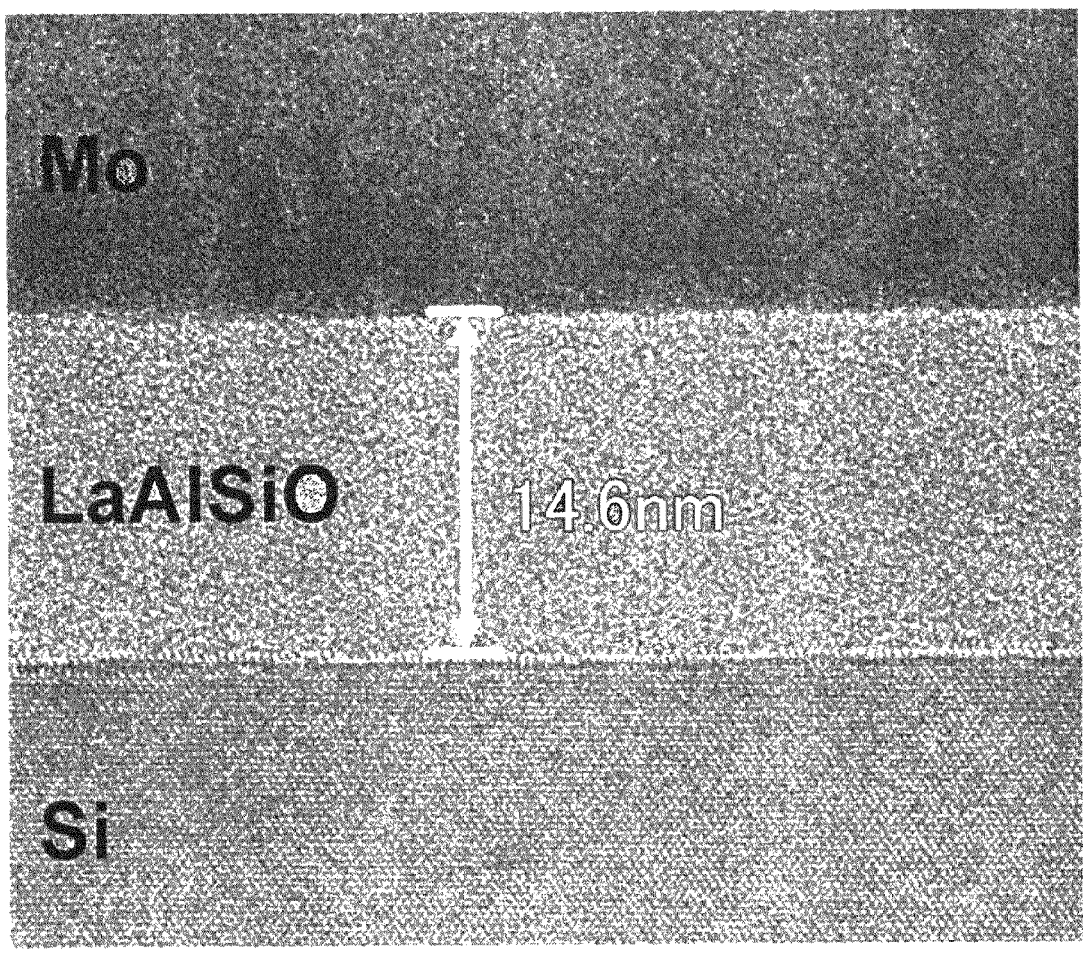
FIG. 3 is a cross sectional TEM image of an LaAlSiO film.

Hereinafter, the present invention will be described in detail with reference to the drawings.

(First Semiconductor Device)

A first semiconductor device includes a semiconductor substrate, a stacking structure made of a tunnel insulating film, an electric charge storage layer, atop insulating film and a control gate electrode which are subsequently formed on the semiconductor substrate, side walls formed to cover the side surfaces of the stacking structure and impurity doped layers which are formed at the surface of the semiconductor substrate at both sides of the tunnel insulating film.

In the first semiconductor device, it is required that the top insulating film is made of an oxide of at least one metal M selected from the group of rare earth metal, Y, Zr and Hf; Al; and Si (First Requirement). The oxide containing the metal M can exhibit a higher dielectric constant and also a higher crystallization temperature due to containing of the Al element, so that the first requirement is a precondition for the top insulating film.

Then, it is required that the number ratio Si/M of the Si element to the M element of the top insulating film is set to a number ratio Si/M or more at the solid solubility limit of the $SiO_2$ composition in the composite oxide made of the metal M and the Al element (Second Requirement) and set to a number ratio Si/M or less at the condition that the dielectric constant of the top insulating film is equal to the dielectric constant of $Al_2O_3$ (Third Requirement). Moreover, it is required that the number ratio Al/M of the Al element to the M element of the top insulating film is set to a number ratio Al/M or more where the crystallization of the oxide MO is suppressed due to the Al element and set to a number ratio Al/M or less where the crystallization of the $Al_2O_3$ is suppressed due to the M element (Fourth Requirement). The second requirement through the fourth requirement will be described hereinafter.

<Number ratio Si/M of Si element to M element is set to number ratio Si/M or more at solid solubility limit of $SiO_2$ composition in composite oxide made of metal M and Al element (Second Requirement)>

In the top insulating film of the first semiconductor device, it is required that the number ratio Si/M of the Si element to the M element is set to the number ratio Si/M or more at the solid solubility limit of the $SiO_2$ composition in the composite oxide made of the metal M and the Al element. Thereby, in the case that the side walls of the first semiconductor device are made of $SiO_2$, particularly, even though the control electrode is made of polysilicon and thermally treated for impurity activation, the reaction between the top insulating film and the side walls can be suppressed.

Namely, since the top insulating film already contains $SiO_2$ composition at a ratio of the solid solubility limit thereof or more, the $SiO_2$ composition in the sidewalls is not infiltrated into the top insulating film even though it is thermally treated as described above. Therefore, the reaction between the top insulating film and the side walls can be suppressed so as not to deteriorate the characteristics of the first semiconductor memory device.

In the case that the side walls are made of SiON, if the top insulating film contains $SiO_2$ composition at a ratio of the solid solubility limit thereof or more, the $SiO_2$ composition segregated from the side walls is not infiltrated into the top insulating film. Therefore, the reaction between the top insulating film and the side walls can be suppressed so as not to deteriorate the characteristics of the first semiconductor memory device.

In the case that the side walls are made of SiN, if the top insulating film contains $SiO_2$ composition at a ratio of the solid solubility limit thereof or more, the SiN composition, $SiO_2$ impurity and the like of the side walls is not infiltrated into the top insulating film. Therefore, the reaction between the top insulating film and the side walls can be suppressed so as not to deteriorate the characteristics of the first semiconductor memory device.

In the case that the electric charge storage layer is made of SiN or SiON, since the top insulating film contains $SiO_2$ composition at a ratio of the solid solubility limit thereof or more, the SiN composition, $SiO_2$ impurity and the like of the electric charge storage layer is not infiltrated into the top insulating film. Therefore, the reaction between the top insulating film and the electric charge storage layer can be suppressed so as not to deteriorate the characteristics of the first semiconductor memory device.

Then, in the case that the metal M is La element so that the top insulating film can be represented by LaAlSiO composition, the number ratio of Si/La at a solid solubility limit of $SiO_2$ composition in a composite oxide LaAlO is quantified. First of all, a $SiO_2$ film was formed on a LaAlO film in which the Al/La ratio thereof was varied, and thermally treated at 900° C. for 30 seconds under $N_2$ atmosphere so as to be reacted with the LaAlO film. FIG. 1 is a graph showing the relation between the content of the Si element solid-solved in the LaAlO film and the content of the La element in the LaAlO film.

As shown in FIG. 1, it is apparent that the relation of the Si/La number ratio-1 is satisfied, irrespective of the La/Al number ratio. On the other hand, since the solid solubility limit of the $SiO_2$ composition in a $La_2O_3$ composition satisfies the relation of the Si/La number ratio=1, the solid solubility limit of the $SiO_2$ composition in the LaAlO film is almost equal to the solid solubility limit of the $SiO_2$ in the $La_2O_3$ composition. Therefore, if the relation of the number ratio Si/La≧1 is satisfied, the LaAlSiO composition contains the $SiO_2$ composition within a range of the solid solubility limit thereof or more, and thus, the second requirement can be satisfied.

In view of the inclination of the approximate line shown in FIG. 1, if the relation of Si/La≧0.93 is satisfied strictly, the LaAlSiO composition contains the $SiO_2$ composition within a range of the solid solubility limit thereof or more.

<Number ratio Si/M of Si element to M element is set to number ratio Si/M or less at condition that dielectric constant of top insulating film is equal to dielectric constant of $Al_2O_3$ (Third Requirement)>

As described above, the top insulating film is made of an oxide of at least one metal M selected from the group of rare earth metal, Y, Zr and Hf; Al; and Si. In this case, if the content ratio in element of the top insulating film is changed, the dielectric constant of the top insulating film is also changed. Herein, it is required that the content ratio in elements of the top insulating film is set to a prescribed value so that the dielectric constant of the top insulating film is not decreased below a prescribed value and thus, the top insulating film can maintain a desired high dielectric constant.

In this point of view, an $Al_2O_3$ film commercially available as an insulating film with high dielectric film is employed as a benchmark and the prescribed dielectric constant of the top insulating film is set to the dielectric constant of the $Al_2O_3$ film or more. In the case that the top insulating film is represented by MAlSiO composition, since the dielectric constant of the $Al_2O_3$ film is 10 and the dielectric constant of the $SiO_2$ film is 3.9, the dielectric constant of the MAlSiO composition can be represented as follows:

$$(M \times k + Al \times 10 + Si \times 3.9)/(M+Al+Si),$$

where the dielectric constant of the oxide MO containing the metal M is set to "k" and the number ratio of M, Al, Si is M:Al:Si.

In this point of view, in order to set the dielectric constant of the top insulating film equal to the dielectric constant of the $Al_2O_3$ film or more, it is required to satisfy the relation of $10 \leq (M \times k + Al \times 10 + Si \times 3.9)/(M+Al+Si)$. When the relation is transformed, the relation of $Si/M \leq (k-10)/6.1$ can be obtained. Therefore, the upper limit of the number ratio Si/M can be defined.

The lower limit of the number ratio Si/M can be defined referring to the solid solubility limit of the $SiO_2$ composition in the MAlO composition as described in the second requirement. Suppose that the number ratio Si/M at the solid solubility limit of the $SiO_2$ composition is set to "x", the relation of "x"$\leq$Si/M must be satisfied so as to satisfy the second requirement. As a result, the number ratio Si/M satisfying the second requirement and the third requirement can be represented by the relation of $x \leq Si/M \leq (k-10)/6.1$. In the case that the metal M is La element, the solid solubility limit of the $SiO_2$ composition in the LaAlO film is almost equal to the solid solubility limit of the $SiO_2$ in the $La_2O_3$ composition. Therefore, if metal M is other material, the number ratio x is almost equal to the number ratio Si/M at solid solubility limit of the $SiO_2$ in the MO composition.

In this case, the number ratio "x" and the dielectric constant "k" are required to satisfy the relation of $x \leq (k-10)/6.1$. The metal M selected from the group consisting of rare earth metal, Y, Zr, and Hf contained in the top insulating film, must satisfy the relation of $x \leq (k-10)/6.1$.

For example, in the case that the metal M is La element, since the dielectric constant k of the composite oxide $La_2O_3$ is 27 and the number ratio x of Si/La is 0.93 at the solid solubility limit of the $SiO_2$ composition, the relation of $x \leq Si/M \leq (k-10)/6.1$ can be transformed into the relation of $0.93 \leq Si/La \leq 2.78$ by the substitution of the dielectric constant of $La_2O_3$ and the number ratio x of Si/La=0.93.

In the case that the metal M is Zr element, since the dielectric constant k of the composite oxide $ZrO_2$ is 25 and the number ratio x of Si/Zr is 1 at the solid solubility limit of the $SiO_2$ composition, the relation of $x \leq Si/M \leq (k-10)/6.1$ can be transformed into the relation of $1 \leq Si/Zr \leq 2.459$ by the substitution of the dielectric constant of $ZrO_2$ and the number ratio x of Si/Zr=1. In the case that the metal M is Hf element, since the dielectric constant k of the composite oxide $HfO_2$ is 25 and the number ratio x of Si/Hf is 1 at the solid solubility limit of the $SiO_2$ composition, the relation of $x \leq Si/M \leq (k-10)/6.1$ can be transformed into the relation of $1 \leq Si/Hf \leq 2.459$ by the substitution of the dielectric constant of $HfO_2$ and the number ratio x of Si/Hf=1.

<Number ratio Al/M of Al element to M element is set to number ratio Al/M or more where crystallization of oxide MO is suppressed due to Al element and set to number ratio Al/M or less where crystallization of $Al_2O_3$ is suppressed due to M element (Fourth Requirement)>

The number ratio Al/M of the Al element to the M element is required to be set to a number ratio Al/M so that the crystallization of the oxide MO and the $Al_2O_3$ can be suppressed, which is originated from that if some crystal phases are formed in the top insulating film, some conduction paths are formed at the crystal boundaries so that the insulation of the top insulating film is deteriorated and some leak currents may be generated.

Moreover, in the case that the MAlSiO oxide layer is formed by mixing the $SiO_2$ layer with the MAlO composite layer by thermally treating, the crystallization of the oxide MO and the $Al_2O_3$ at the thermal treatment makes nonuniform the reaction between the $SiO_2$ layer and the MAlO composite layer and difficult the formation of the uniform MAlSiO oxide layer.

Since a crystal is made of a plurality of unit cells which are alternately arranged, a heterogeneous element which does not constitute the crystal inherently disturbs the alternate arrangement of the unit cells and disturbs the growth of the crystal. Therefore, the Al element functions as a heterogeneous element for the MO oxide and the M element functions as a heterogeneous element for the $Al_2O_3$ so as to suppress the crystallization of the MO oxide and the $Al_2O_3$. In view of the suppression of crystallization effectively and efficiently, it is desired that one or more heterogeneous element is located for eight unit cells. In this case, since the one or more heterogeneous element is located for the adjacent unit cells on average, the crystallization of the MO oxide and the $Al_2O_3$ can be suppressed effectively and efficiently because the MO oxide and the $Al_2O_3$ can not exhibit translational symmetry.

The embodiment of the metal M being La element will be described hereinafter. The Al element is a heterogeneous element for the $La_2O_3$ composition. Since two La atoms are contained in the unit cell of the $La_2O_3$ composition, 16 La atoms are contained in eight unit cells. In order that one or more Al atoms are located for the adjacent unit cells of the $La_2O_3$ composition on average, therefore, it is required that the number ratio Al/La satisfies the relation of $1/16 \leq Al/La$. As a result, the crystallization of the $La_2O_3$ composition can be suppressed.

The La atom is a heterogeneous atom for the $Al_2O_3$ composition. Since 12 Al atoms are contained in the unit cell of the $\alpha$-$Al_2O_3$ composition, 96 Al atoms are contained in eight unit cells. In order that one or more La atoms are located for the adjacent unit cells of the $Al_2O_3$ composition on average, therefore, it is required that the number ratio La/Al satisfies the relation of $1/96 \leq La/Al$ and thus, the number ratio Al/La satisfies the relation of $Al/La \leq 96$. As a result, the crystallization of the $Al_2O_3$ composition can be suppressed.

Accordingly, in view of the suppression of the $La_2O_3$ crystallization and the $Al_2O_3$ crystallization, it is desired that the relation of $0.0625 \leqq Al/La \leqq 96$ is satisfied.

FIG. 2 is a view showing the number of the M atoms per unit cell of the oxide MO (M=Y, Pr, Zr, Nd, Sm, Gd, Hf), and the lower limited value and the upper limited value of the Al/M number ratio.

(Second Semiconductor Device)

A second semiconductor device includes a semiconductor substrate, a stacking structure made of a gate insulating film and a gate electrode which are subsequently formed on the semiconductor substrate, side walls to cover the sides of the stacking structure and impurity doped layers which are formed at the surface of the semiconductor substrate at both sides of the gate insulating film.

In the second semiconductor device, it is required that the gate insulating film is made of an oxide of at least one metal M selected from the group of rare earth metal, Y, Zr and Hf; Al; and Si (First Requirement). Then, it is required that the number ratio Si/M of the number of Si to the number of M is set to the number ratio Si/M or more at the solid solubility limit of the $SiO_2$ in the composite oxide made of the metal M and the Al element (Second Requirement) and set to a number ratio Si/M or less at the condition that the dielectric constant of the gate insulating film is equal to the dielectric constant of $Al_2O_3$ (Third Requirement). Moreover, it is required that the number ratio Al/M of the Al element to the M element is set to a number ratio Al/M or more where the crystallization of the oxide MO is suppressed due to the Al element and set to a number ratio Al/M or less where the crystallization of the $Al_2O_3$ is suppressed due to the M element (Fourth Requirement). The second requirement through the fourth requirement will be described hereinafter.

<Gate insulating film is made of oxide of at least one metal M selected from the group of rare earth metal, Y, Zr and Hf; Al; and Si (First Requirement)>

The oxide containing the metal M can exhibit a higher dielectric constant and also a higher crystallization temperature due to containing of the Al element so that the first requirement is a precondition for the top insulating film.

FIG. 3 is a cross sectional TEM image of an LaAlSiO film. The LaAlSiO film was made as follows: First of all, an LaAlO film was formed on a $SiO_2$ with a thickness of 5 nm film made by thermal oxidation, and thermally treated at 900° C. for 30 seconds under $N_2$ atmosphere. In this case, the ratio of La, Al and Si was set to La:Al:Si=1:1:1.2. As apparent from FIG. 3, the LaAlSiO is maintained uniformly amorphous after the thermal treatment of 900° C.

Figure 4:
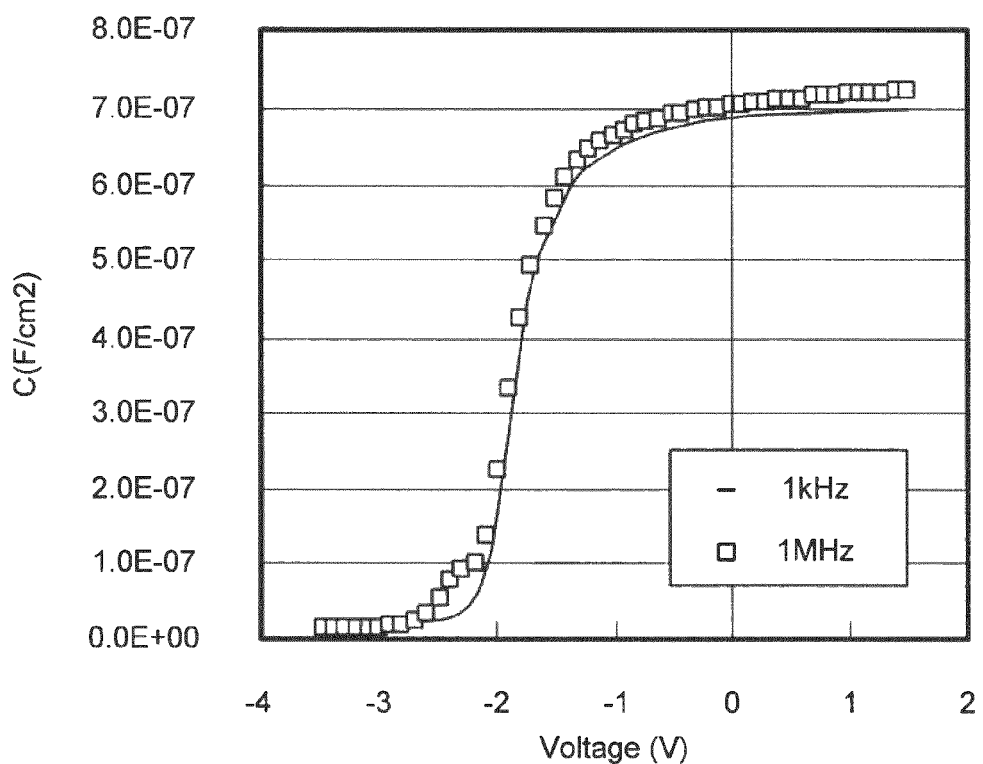
FIG. 4 is a graph showing the C-V (capacitance vs voltage) characteristic of the LaAlSiO film.
Figure 5:
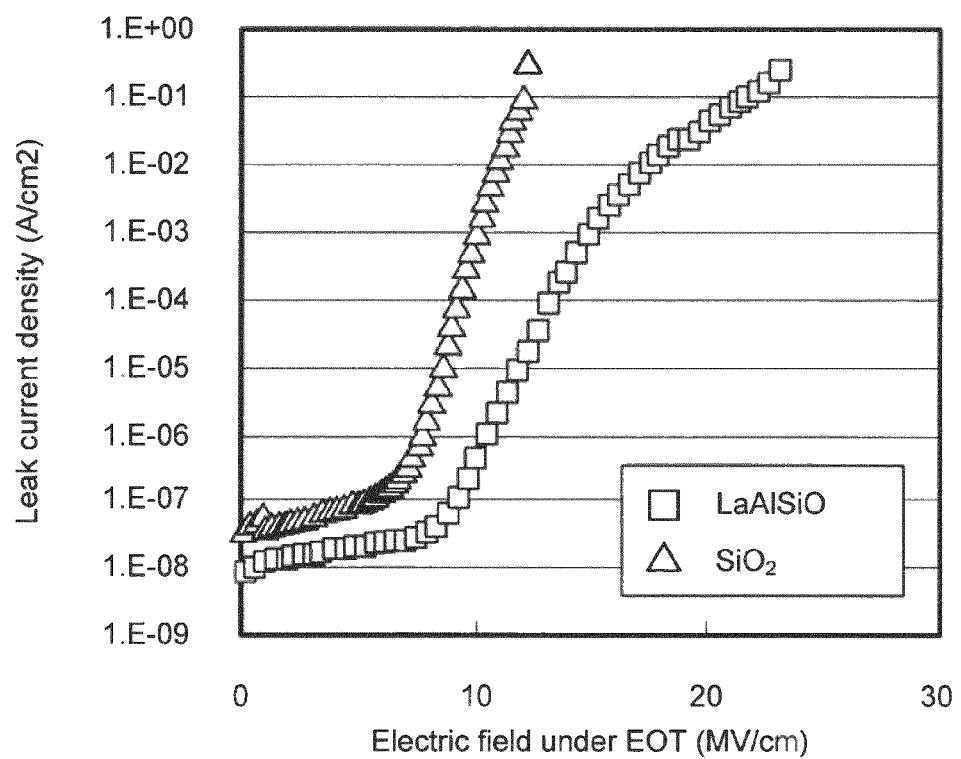
FIG. 5 is a graph showing the leak current density-electric field under the condition of effective oxide thickness (EOT) of the LaAlSiO film.

FIG. 4 is a graph showing the C-V (capacitance vs voltage) characteristic of the LaAlSiO film. FIG. 5 is a graph showing the leak current density-electric field under the condition of effective oxide thickness (EOT) of the LaAlSiO film. As apparent from FIG. 4, since the C-V characteristic curve rises drastically, it is turned out that the LaAlSiO film contains only a small quantity of interface states. The dielectric constant (relative permittivity for vacuum condition) of the LaAlSiO film was 12.4, which is derived from the physical thickness in the cross sectional TEM image. As apparent from FIG. 5, the leak current density at the electric field under the condition of effective oxide thickness (EOT) of 10 MV/cm is one-thousandth or less as large as the leak current density of the $SiO_2$ composition at the same condition, so that the leak characteristic of the LaAlSiO film is under good condition.

<Number ratio Si/M of Si element to M element is set to number ratio Si/M or more at solid solubility limit of $SiO_2$ composition in composite oxide made of metal M and Al element (Second Requirement)>

In the gate insulating film of the second semiconductor device, it is required that the number ratio Si/M of the Si element to the M element is set to a number ratio Si/M or more at the solid solubility limit of the $SiO_2$ composition in the composite oxide made of the metal M and the Al element, which is based on the same reason in the first semiconductor device. Namely, in the case that the side walls of the second semiconductor device are made of $SiO_2$, particularly, even though the gate electrode is made of polysilicon and thermally treated for impurity activation, the reaction between the gate insulating film and the side walls can be suppressed.

Namely, since the gate insulating film already contains $SiO_2$ composition at a ratio of the solid solubility limit thereof or more, the $SiO_2$ composition in the sidewalls can not be infiltrated into the gate insulating film even though it is thermally treated. Therefore, the reaction between the gate insulating film and the side walls can be suppressed so as not to deteriorate the characteristics of the second semiconductor memory device.

In the case that the side walls are made of SiON or SiN, the $SiO_2$ composition segregated from the side walls can not be infiltrated into the top insulating film so that the reaction between the gate insulating film and the sidewalls can be suppressed so as not to deteriorate the characteristics of the second semiconductor memory device.

FIG. 6 is a cross sectional TEM image of a stacking structure made of a $SiO_2$ layer, a SiON layer, a LaAlSiO layer, a $SiO_2$ layer which are subsequently formed on a Si substrate before and after thermal treatment at 950° C. for ten minutes under $N_2$ atmosphere. In this case, since the thickness of the SiON layer located under the LaAlSiO layer is not changed, it is turned out the SiON layer does not react with the LaAlSiO layer. Moreover, it can be easily considered that a SiN layer does not react with the LaAlSiO layer because the SiN layer is constituted by substituting all of the oxygen elements of the SiON layer with nitrogen elements.

In the case that the second semiconductor device is a CMOS transistor or the like, such a disadvantage as forming the $SiO_2$ inter layer formed at the surface of the silicon substrate can be avoided. Therefore, the number of interface state caused by the $SiO_2$ inter layer can be decreased so that the characteristics of the transistor is not deteriorated.

The metal M may be set to La element in the same manner as the first semiconductor device. In this case, therefore, the embodiment of the metal M being the La element can be explained as described above.

<Number ratio Si/M of Si to metal M is set to number ratio Si/M or less at condition that dielectric constant of gate insulating film is equal to dielectric constant of $Al_2O_3$ (Third Requirement)>

As described above, the gate insulating film is made of an oxide of at least one metal M selected from the group of rare earth metal, Y, Zr and Hf; Al; and Si. In this case, if the content ratio in element of the gate insulating film is changed, the dielectric constant of the gate insulating film is also changed. Herein, it is required that the content ratio in element of the gate insulating film is set to a prescribed value so that the dielectric constant of the gate insulating film is not decreased below a prescribed value and thus, the gate insulating film can maintain a desired high dielectric constant. In this point of view, an $Al_2O_3$ film commercially available as an insulating film with high dielectric film is employed as a benchmark and the prescribed dielectric constant of the gate insulating film is set to be equal to or more than the dielectric constant of the $Al_2O_3$ film.

In the case that the gate insulating film is represented by MAlSiO composition, it is required that the relation of Si/M≦(k−10)/6.1 is satisfied so that the dielectric constant of the MAlSiO composition can be set to be equal to or more than the dielectric constant of the $Al_2O_3$ film. The lower limited value of the number ratio Si/M can be represented by the relation of x≦Si/M using a number ratio "x" of Si/M at the solid solubility limit of the $SiO_2$ composition in the MAlO composition as described above. As a result, the number ratio Si/M satisfying the second requirement and the third requirement can be represented by the relation of x≦Si/M≦(k−10)/6.1.

The metal M may be set to La element, Zr element or Hf element in the same manner as the first semiconductor device. In this case, therefore, the embodiment of the metal M being the La element, the Zr element or the Hf element can be explained as described above.

<Number ratio Al/M of Al element to M element is set to number ratio Al/M or more where crystallization of oxide MO is suppressed due to the Al element and set to the number ratio Al/M or less where the crystallization of $Al_2O_3$ is suppressed due to M element (Fourth Requirement)>

The number ratio Al/M of the Al element to the M element is also required to be set to the number ratio Al/M so that the crystallization of the oxide MO and the $Al_2O_3$ can be suppressed, which is originated from that if some crystal phases are formed in the gate insulating film, the insulation and flatness of the gate insulating film is deteriorated due to the grain boundaries from the crystal phases to deteriorate the performance of the semiconductor device.

Concretely, the Al element is a heterogeneous element for the MO composition and the M element is a heterogeneous element for the $Al_2O_3$ composition. In order to suppress the crystallization of the oxide MO and the $Al_2O_3$ effectively and efficiently, it is desired that one or more heterogeneous element is located for eight unit cells. In this case, since the one or more heterogeneous element is located for the adjacent unit cells on average, the crystallization of the MO oxide and the $Al_2O_3$ can be suppressed effectively and efficiently because the MO oxide and the $Al_2O_3$ can not exhibit translational symmetry.

The metal M may be set to the La element in the same manner as the first semiconductor device. In this case, therefore, the embodiment of the metal M being the La element can be explained as described above.

(LaAlSiO Top Insulating Film and Gate Insulating Film)

Then, the first semiconductor device and the second semiconductor device will be described in detail when the top insulating film and the gate insulating film contain the LaAlSiO composition. Fundamentally, the oxide containing La element can exhibit high dielectric constant and also, if the oxide contains Al element, high crystallization temperature. As described above, only if the LaAlSiO composition contains the Si element ($SiO_2$ composition) at a ratio of the solid solubility limit thereof, the LaAlSiO composition can not react with the $SiO_2$ composition, SiON composition or SiN composition of the side walls.

In the case that the top insulating film and the gate insulating film are made of the LaAlSiO composition, the top insulating film and the gate insulating film contain $LaAlSiO_5$ crystal phase when the relation of La:Al:Si=1:1:1 is satisfied. In this case, since the leak characteristics of top insulating film and the gate insulating film are deteriorated due to the $LaAlSiO_5$ crystal phase, it is desired to suppress the forming of the $LaAlSiO_5$ crystal phase.

Whether the top insulating film and the gate insulating film contain the $LaAlSiO_5$ crystal phase (that is, the $LaAlSiO_5$ crystal phase is formed in the top insulating film and the gate insulating film) depends on the composition ratio of the La element, the Al element and the Si element of the oxide with the LaAlSiO composition, especially depends on the composition ratio of the Si element to the La and Al elements. In this case, therefore, it is required that the ratio Si/(La+Al) is set so that the $LaAlSiO_5$ crystal phase is not formed in the top insulating film and the gate insulating film in order to use the LaAlSiO as the top insulating film and/or the gate insulating film.

As described above referring to FIG. 3, when the relation of number ratio La:Al:Si=1:1:1.2 is satisfied, the LaAlSiO film becomes amorphous so that the formation of the $LaAlSiO_5$ crystal phase can be suppressed by increasing the ratio of the Si element.

In the case that the relation of number ratio La:Al:Si=1:1:1.2 is satisfied, the LaAlSiO film does not contain the $LaAlSiO_5$ crystal phase as shown in FIG. 3 so that the number ratio of the Si element is set to 1.2 or more for the number ratio of the La element of 1 and the number ratio of the Al element of 1. As a result, the relation of the ratio Si/(La+Al)≧0.6 is required.

The dielectric constant of the LaAlSiO oxide is set to the dielectric constant of the $Al_2O_3$ composition as a benchmark or more. Since the dielectric constant of the LaAlSiO composition can be represented by (La×27+Al×10+Si×3.9)/(La+Al+Si), it is required the relation of (La×27+Al×10+Si×3.9)/(La+Al+Si)≧10 is satisfied. Therefore, the relation of Si/(La+Al)≦2.78 is required.

Since the dielectric constant of the amorphous LaAlSiO oxide is 12.4 as shown in FIG. 3, the above described relation of Si/(La+Al)≦2.78 is satisfied for the amorphous LaAlSiO oxide. Herein, it is desired that the dielectric constant of the LaAlSiO oxide becomes higher insofar as the LaAlSiO oxide is amorphous. Concretely, it is desired that the dielectric constant of the LaAlSiO oxide approximates the dielectric constant of $La_2O_3$ of 27. However, since the LaAlSiO oxide must contain the Si element so as to be amorphous, the dielectric constant of the LaAlSiO oxide becomes lower than the dielectric constant of $La_2O_3$ of 27.

(Concrete Embodiment of First Semiconductor Device)

Figure 7:
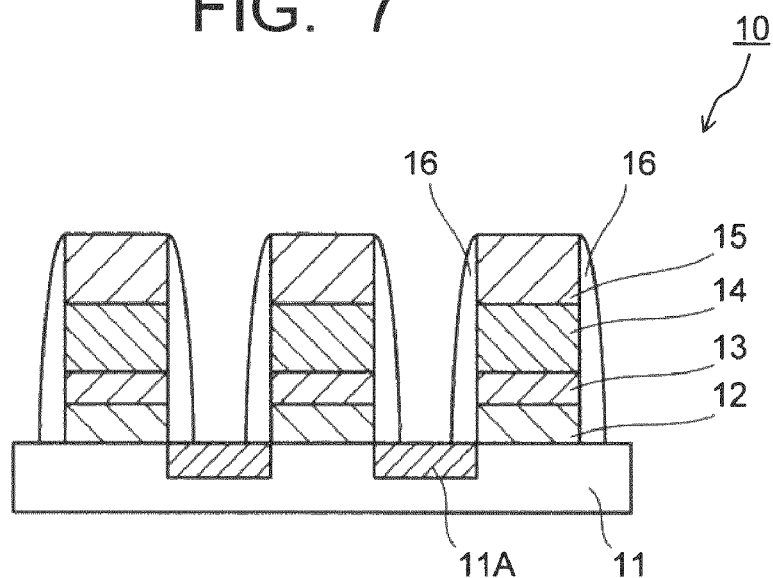
FIG. 7 is a cross sectional view showing a NAND type flash memory as an embodiment of a first semiconductor device.

FIG. 7 is a cross sectional view showing a NAND type flash memory as an embodiment of a first semiconductor device. FIG. 7 shows the NAND type flash memory along the channel direction thereof.

As shown in FIG. 7, the NAND type flash memory 10 in this embodiment is configured such that a tunnel insulating film 12, an electric charge storage layer 13, a top insulating film 14 and a control electrode 15 which are subsequently formed on a silicon substrate 11. Then, side walls 16 are formed so as to cover the sides of the stacking structure made of the tunnel insulating film 12 through the control electrode 15 and impurity doped layers 11A are formed at the surface of the silicon substrate 11 at both sides of the tunnel insulating film 12.

The tunnel insulating film 12 may be made of a $SiO_2$ film with a thickness of 2 to 6 nm formed by thermally oxidizing the silicon substrate 11. The electric charge storage layer 13 may be made of a SiN film with a thickness of 1 to 10 nm formed by means of a conventional technique such as CVD method. The control electrode 15 may be made of a polysilicon film or a conductive nitride film such as a titanium nitride film and a tantalum nitride film. The side walls 16 may be made of $SiO_2$.

The top insulating film 14 is such a top insulating film as described above and thus, made of the oxide of at least one metal M selected from the group of rare earth metal, Y, Zr and Hf, Al, and Si. Therefore, even though a predetermined thermal treatment is conducted for the top insulating film 14 in the manufacturing process of the flash memory 10, the top insulating film 14 is not reacted with the side walls 16. Therefore, the characteristics of the flash memory is not deteriorated.

The electric charge storage layer 13 may be configured as a dotted electric charge storage layer containing micro crystal structures in the matrix thereof. The micro crystal structures are made of at least one selected from the group consisting of Si, Ti, Hf, Ge, or an oxide, a nitride or an oxynitride thereof. Instead of the electric charge storage layer 13, a floating gate may be provided so as to constitute a floating gate type flash memory. The floating gate is made of polysilicon.

Then, the manufacturing method of the NAND type flash memory shown in FIG. 7 will be described. FIGS. 8 to 13 relate to the manufacturing steps of the NAND type flash memory 10.

Figure 8:
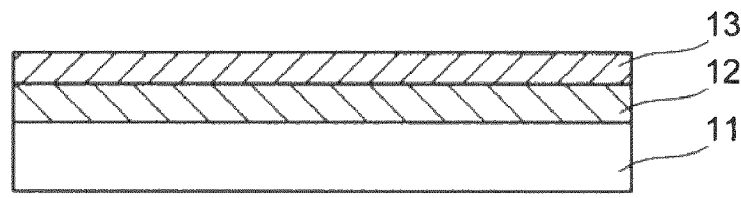
FIG. 8 is a cross sectional view showing one step in the manufacturing method of the NAND type flash memory shown in FIG. 7.

First of all, as shown in FIG. 8, the tunnel insulating film 12 and the electric charge storage layer 13 are subsequently formed on the silicon substrate 11. As described above, the tunnel insulating film 12 can be formed by thermally oxidizing the silicon substrate 11, and the electric charge storage layer 13 can be formed by means of the conventional technique such as CVD method.

Figure 9:
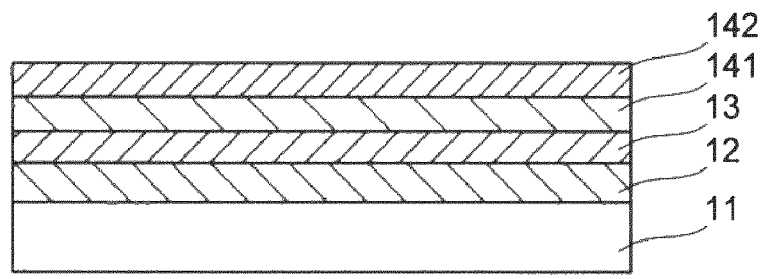
FIG. 9 is also a cross sectional view showing one step in the manufacturing method of the NAND type flash memory shown in FIG. 7.

Then, as shown in FIG. 9, at least two layers selected from an $SiO_2$ layer, an oxide layer containing at least one metal M selected from the group of rare earth metal, Y, Zr and Hf, an $Al_2O_3$ layer and a composite oxide layer of metal M and Al are formed on the electric charge storage layer 13. In this embodiment, the $SiO_2$ layer 141 and the MAlO composite oxide layer 142 are subsequently formed. The $SiO_2$ layer 141 and the MAlO composite oxide layer 142 may be formed by means of a conventional technique such as ALD (atomic layer deposition), CVD, thermal deposition, electron beam deposition or sputtering. In the case that the electric charge storage layer 13 is made of SiN or SiON as in this embodiment, the $SiO_2$ layer 141 can be formed by oxidation of the surface of the electric charge storage layer 13. In this case, the $SiO_2$ layer 141 contain nitrogen element, the top insulating layer 14 formed by mixing the $SiO_2$ layer 141 with the MAlO composite oxide layer 142 also contains the nitrogen element and thus, exhibits LaAlSiON composition, for example. The dielectric constant of the LaAlSiON composition is higher than the dielectric constant of LaAlSiO composition. The MAlO composite oxide layer 142 may be formed by ion-implanting the metal M into an $Al_2O_3$ layer.

Figure 10:
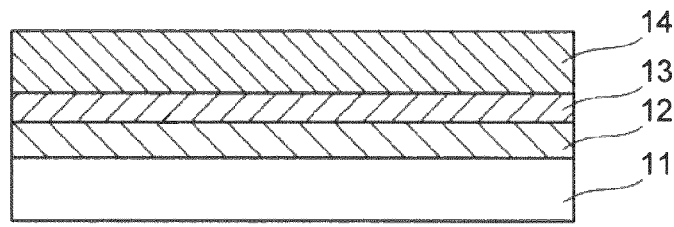
FIG. 10 is also a cross sectional view showing one step in the manufacturing method of the NAND type flash memory shown in FIG. 7.

Then, the thus obtained stacking structure is thermally treated within a temperature range of 900 to 1000° C. for 30 seconds under the nitrogen atmosphere of 760 Torr to mix the $SiO_2$ layer 141 with the MAlO composite layer 142 and thus, form the top insulating film 14 made of the MAlSiO oxide layer (FIG. 10).

The thermal treatment for the formation of the top insulating film 14 may be conducted after the formation of the control electrode 15 to be described hereinafter. In this case, the oxidation of the electric charge storage layer 13 can be prevented because external excess oxygen component is not incorporated into the electric charge storage layer 13. Moreover, if the control electrode 15 is made of the polysilicon, the thermal treatment can be conducted as the annealing treatment for impurity activation of the control electrode 15, so that the number of the manufacturing steps for the flash memory 10 can be reduced. Moreover, the thermal treatment may be conducted at any stage before the side walls are formed. For example, the thermal treatment may be conducted after the patterning step to be described hereinafter.

Figure 11:
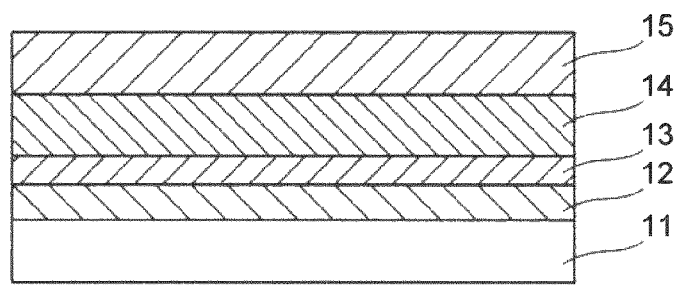
FIG. 11 is also a cross sectional view showing one step in the manufacturing method of the NAND type flash memory shown in FIG. 7.
Figure 12:
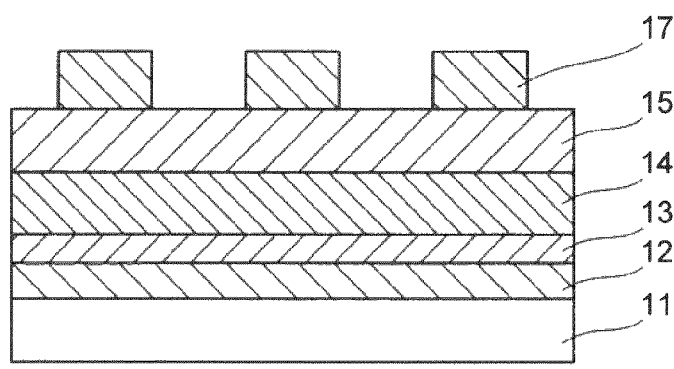
FIG. 12 is also a cross sectional view showing one step in the manufacturing method of the NAND type flash memory shown in FIG. 7.
Figure 13:
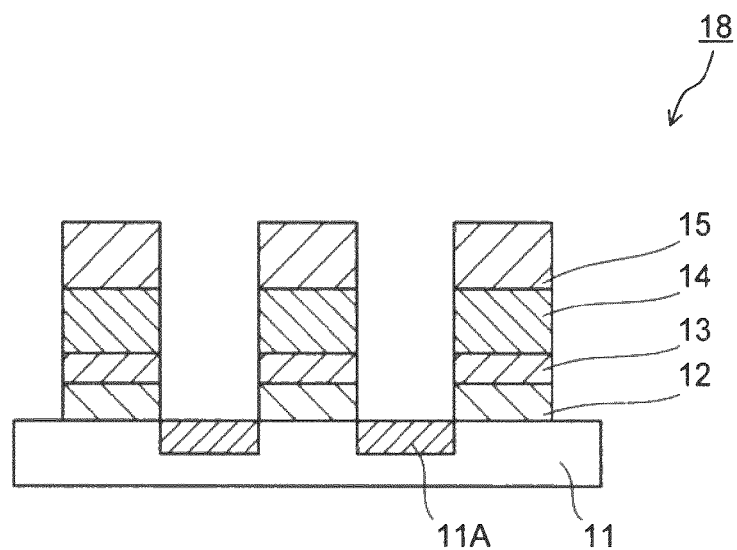
FIG. 13 is also a cross sectional view showing one step in the manufacturing method of the NAND type flash memory shown in FIG. 7.

Then, as shown in FIG. 11, the control gate 15 is formed on the top insulating film 14, and as shown in FIG. 12, a photoresist pattern 17 is formed on the control electrode 15. Then, as shown in FIG. 13, the control electrode 15, the top insulating film 14, the electric charge storage layer 13 and the tunnel insulating layer 12 are subsequently etched and divided in the stacking direction by means of reactive ion etching using the photoresist pattern 17 as a mask to form a stacking structure 18 made of the tunnel insulating film 12, the electric charge storage layer 13, the top insulating film 14, and the control electrode 15 which are subsequently stacked.

Then, the side walls 16 are formed of $SiO_2$ at both sides of the stacking structure 18, and ion implantation is conducted using the stacking structure 18 and the side walls 16 as a mask to form the impurity doped layers 11A and thus, form the NAND type flash memory 10 as shown in FIG. 7. The impurity doping (ion implantation) is conducted under the condition that the phosphorus accelerating voltage is set to 40 keV and the phosphorus dose amount is set to $2 \times 10^{15}$ $cm^2$.

(Concrete Embodiment of Second Semiconductor Device)

Figure 14:
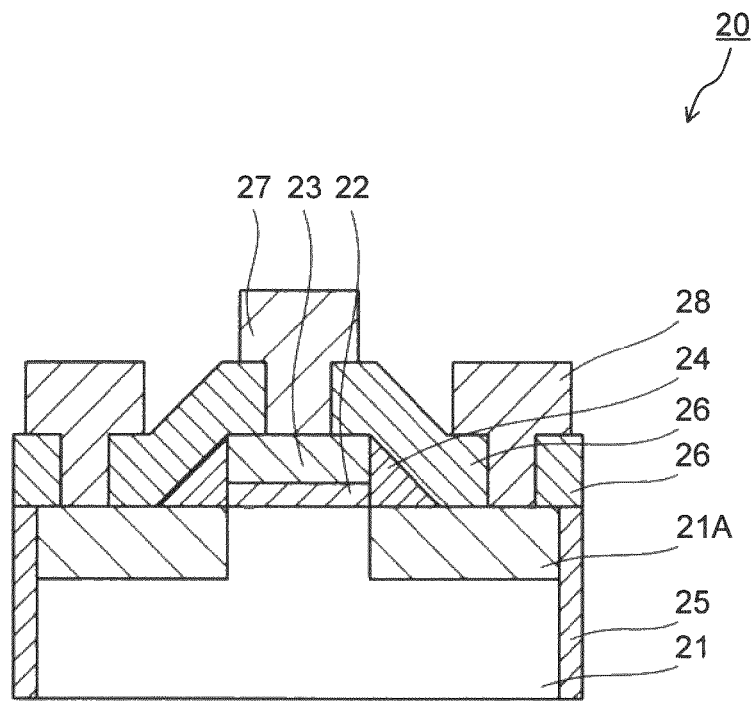
FIG. 14 is a cross sectional view showing a field-effect transistor as an embodiment of a second semiconductor device.

FIG. 14 is a cross sectional view showing a field-effect transistor as an embodiment of a second semiconductor device.

As shown in FIG. 14, the field-effect transistor 20 in this embodiment is configured such that a gate insulating film 22 and a gate electrode 23 are formed on a silicon substrate 21. Then, side walls 24 are formed of e.g., SiN so as to cover the sides of the stacking structure made of the gate insulating film 22 and the gate electrode 23. Then, element separation insulating films 25 are formed of e.g., $SiO_2$ in the silicon substrate 21. Then, impurity doped layers 21A are formed at the surface of the silicon substrate 21 at both sides of the gate insulating films 22.

A wiring layer 27 is electrically connected with the gate electrode 23 via interlayer insulating film 26 made of e.g., $SiO_2$, and wiring layers 28 are also electrically connected with the impurity doped layers 21A of the silicon substrate 21 via the interlayer insulating film 26. The wiring layer 27 functions as a gate wiring layer and the wiring layers 28 function as signal wiring layers, respectively.

The gate insulating film 22 is such a gate insulating film as described above and thus, made of the oxide of at least one metal M selected from the group of rare earth metal, Y, Zr and Hf; Al; and Si. Therefore, even though a predetermined thermal treatment is conducted for the gate insulating film 22 in the manufacturing process of the field-effect transistor 20, the gate insulating film 22 can not be reacted with the side walls 24 made of SiN. Moreover, the gate insulating film 22 does not include the $SiO_2$ inter layer formed at the surface of the silicon substrate 21. Therefore, the number of interface state caused by the $SiO_2$ inter layer can be decreased so that the characteristics of the transistor is not deteriorated.

The gate electrode 23 is made of polysilicon, conductive nitride such as titanium nitride and tantalum nitride, or a metallic silicide such as titanium silicide, cobalt silicide, nickel silicide, platinum silicide, palladium silicide, erbium silicide, ytterbium silicide, ruthenium silicide, samarium silicide, strontium silicide, yttrium silicide and lanthanum silicide. Alternatively, the gate electrode 23 may be made of two or more silicides listed above, that is, a ternary or more silicide. The wiring layers 27 and 28 may be made of an electric conductive material such as Au, Pt, Al, Cu.

Then, the manufacturing method of the field-effect transistor 20 shown in FIG. 14 will be described. FIGS. 15 to 21 relate to the manufacturing steps of the field-effect transistor 20.

Figure 15:
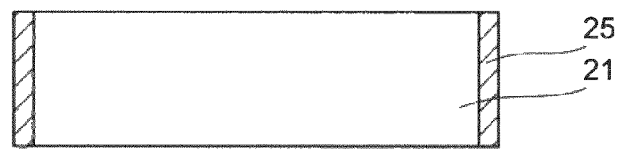
FIG. 15 is a cross sectional view showing one step in the manufacturing method of the field-effect transistor shown in FIG. 14.

First of all, as shown in FIG. 15, reactive ion etching is conducted for the silicon substrate 21 to form trenches for element separation, and then, the trenches are embedded by $SiO_2$ or the like by means of CVD to form the element separation insulating films 25. Then, thermal oxidation is conducted for the silicon substrate 21 to form a $SiO_2$ film (not shown) at the surface of the silicon substrate 21. The not shown $SiO_2$ film may be formed directly by means of CVD instead of the thermal oxidation.

Figure 16:
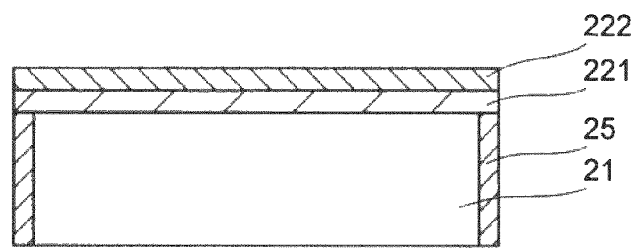
FIG. 16 is also a cross sectional view showing one step in the manufacturing method of the field-effect transistor shown in FIG. 14.
Figure 17:
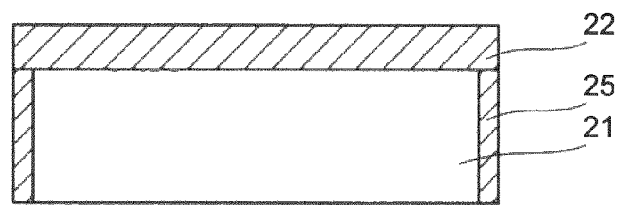
FIG. 17 is also a cross sectional view showing one step in the manufacturing method of the field-effect transistor shown in FIG. 14.
Figure 18:
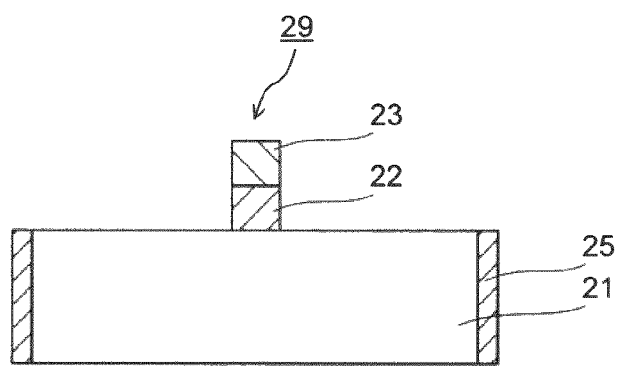
FIG. 18 is also a cross sectional view showing one step in the manufacturing method of the field-effect transistor shown in FIG. 14.

Then, as shown in FIG. 16, at least two layers selected from an $SiO_2$ layer, an oxide layer containing at least one metal M selected from the group of rare earth metal, Y, Zr and Hf, an $Al_2O_3$ layer and a composite oxide layer of metal M and Al are formed on the silicon substrate 21 via the $SiO_2$ film formed by the thermal oxidation. In this embodiment, the $SiO_2$ layer 221 and the MAlO composite oxide layer 222 are subsequently formed. The $SiO_2$ layer 221 and the MAlO composite oxide layer 222 may be formed by means of a conventional technique such as ALD (atomic layer deposition), CVD, thermal deposition, electron beam deposition or sputtering. Moreover, the MAlO composite oxide layer 222 may be formed by ion-implanting the metal M into an $Al_2O_3$ layer.

Then, the thus obtained stacking structure is thermally treated within a temperature range of 900 to 1000° C. for 30 seconds under the nitrogen atmosphere of 760 Torr to mix the $SiO_2$ layer 221 with the MAlO composite oxide layer 222 and thus, form the gate insulating film 22 made of the MAlSiO oxide layer.

The thermal treatment for the formation of the gate insulating film 22 may be conducted after the formation of the gate electrode 23 to be described hereinafter. In this case, the oxidation of the silicon substrate 21 can be prevented not to form the low dielectric constant layer at the surface thereof because external excess oxygen component is not incorporated into the silicon substrate 21. Moreover, if the control electrode 15 is made of the polysilicon, the thermal treatment can be conducted as the annealing treatment for impurity activation of the gate electrode 23, so that the number of the manufacturing steps for the field-effect transistor 20 can be reduced. The thermal treatment may be conducted at any stage before the side walls are formed. For example, the thermal treatment may be conducted after the patterning step to be described hereinafter.

Then, a gate electrode layer is formed on the gate insulating film 22, and patterned to form a stacking structure 29 made of the gate insulating film 22 and the gate electrode 23 which are subsequently formed on the silicon substrate 21.

Figure 19:
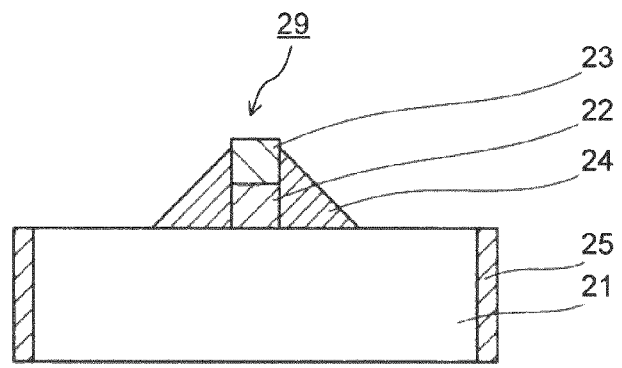
FIG. 19 is also a cross sectional view showing one step in the manufacturing method of the field-effect transistor shown in FIG. 14.
Figure 20:
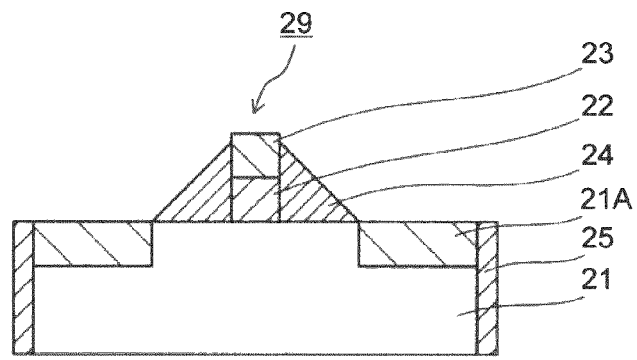
FIG. 20 is also a cross sectional view showing one step in the manufacturing method of the field-effect transistor shown in FIG. 14.

Then, as shown in FIG. 19, a SiN film is formed by means of CVD to form the side walls 24 at both sides of the stacking structure 29 through the reactive ion etching. Then, ion implantation is conducted using the stacking structure 29 and the side walls 24 as a mask to form the impurity doped layers 21A at both sides of the gate insulating film 22.

Figure 21:
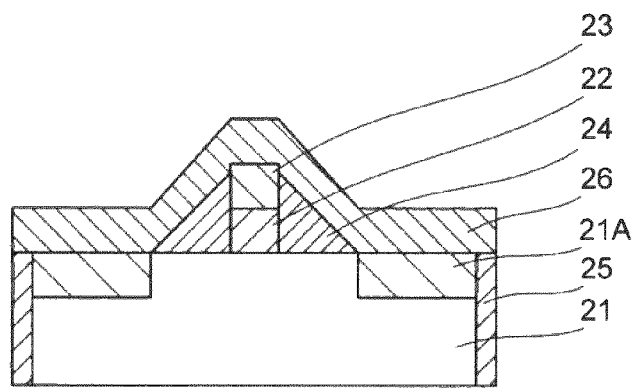
FIG. 21 is also a cross sectional view showing one step in the manufacturing method of the field-effect transistor shown in FIG. 14.

Then, as shown in FIG. 21, the interlayer insulating film 26 is formed of $SiO_2$ so as to cover the stacking structure 29 and the side walls 24. Then, an opening is formed at the top of the interlayer insulating film 26 and the wiring layers 27 and 28 are formed so as to embed the opening, thereby constituting the field-effect transistor 20 as shown in FIG. 14.

Although the present invention was described in detail with reference to the above examples, this invention is not limited to the above disclosure and every kind of variation and modification may be made without departing from the scope of the present invention.

For example, the stacking structure as described above is not always required to be formed on the silicon substrate, but may be formed on the well structure of the silicon substrate. Moreover, the stacking structure may be formed on another substrate such as SiGe substrate, Ge substrate or SiGeC substrate. Furthermore, the stacking structure may be formed on the well structure of the SiGe substrate, Ge substrate or SiGeC substrate. In addition, the stacking structure maybe formed on an SOI (silicon on insulator) substrate with a semiconductor film on an insulating film, a GOI (germanium on insulator) substrate or SGOT (silicon-germanium on insulator) substrate, or on the well structure of the substrate listed above.

In the embodiments, the channel structure is configured flat, but the present invention can be naturally applied for a three-dimensional channel structure typified by a fin structure. Then, the element arrangement is not always required to be plane, but may be set to stacking arrangement or longitudinal arrangement.

In the embodiments, the NAND type flash memory was concretely described, but the present invention can be applied for another type flash memory such as a NOR type flash memory, an AND type flash memory or a DINOR type flash memory. Also, the present invention can be applied for a 3Tr-NAND type flash memory where one storage memory is sandwiched by two selective transistors.

In the embodiments, the quarternary oxide containing metal M, Si, Al and O was concretely described, but the present invention may employ an quaternary or more oxide containing another element in addition to the metal M, Si, Al and O. The oxygen elements of the quarternary oxide may be partially or entirely substituted with nitrogen elements.

What is claimed is:

1. A semiconductor memory device, comprising:
   a semiconductor substrate;
   a stacking structure formed on the semiconductor substrate, the stacking structure including in order:
      a tunnel insulating film,
      an electric charge storage layer,
      a top insulating film made of an oxide including Al, Si, and La, and
      a control electrode;
   a side wall formed on a side of the stacking structure, the side wall being made of at least one selected from the group consisting of $SiO_2$, SiN and SiON; and
   an impurity doped layer formed at a surface of the semiconductor substrate adjacent to the tunnel insulating film,
   wherein the top insulating film has:
      a number ratio Si/La of Si element to La element that is no less than 0.93 and no more than 2.78;
      a number ratio Al/La of Al element to La element that is no less than 0.0625 and no more than 96; and
      a number ratio Si/(La+Al) of Si element to La element and Al element that is no less than 0.6.

2. The semiconductor device of claim 1,
   wherein the top insulating film has a dielectric constant that is 12.4 or more and less than 27.

3. A method for manufacturing a semiconductor memory device, comprising:
   forming a tunnel insulating film and an electric charge storage layer on a semiconductor substrate;
   thermally treating an $SiO_2$ layer and at least two layers selected from an oxide layer of La, an $Al_2O_3$ layer, and a composite oxide layer including La and Al to form a top insulating film on the electric charge storage layer through thermal diffusion;

forming a control electrode on the top insulating film;

etching the tunnel insulating film, the electric charge storage layer, the top insulating film, and the control electrode in a stacking direction thereof to form a stacking structure including the tunnel insulating film, the electric charge storage layer, the top insulating film, and the control electrode;

forming a side wall of at least one selected from the group consisting of $SiO_2$, SiN, and SiON on a side of the stacking structure; and conducting ion implantation for the semiconductor substrate using the stacking structure and the side wall as a mask to form an impurity doped layer at a surface of the semiconductor substrate adjacent to the tunnel insulating film, wherein the thermal treatment is performed to form the top insulating film having:
- a number ratio Si/La of Si element to La element that is no less than 0.93 and no more than 2.78;
- a number ratio Al/La of Al element to La element that is no less than 0.0625 and no more than 96; and
- a number ratio Si/(La+Al) of Si element to La element and Al element that is no less than 0.6.

4. The method of claim 3, wherein the thermal treatment is performed to form the top insulating film having a dielectric constant that is 12.4 or more and less than 27.

* * * * *